United States Patent [19]
Ono et al.

[11] Patent Number: 4,698,240
[45] Date of Patent: Oct. 6, 1987

[54] METHOD FOR MOISTUREPROOF COATING OF AN ELECTRICAL PRODUCT

[75] Inventors: Yusuke Ono; Sachio Ohotoshi, both of Yokohama; Masaru Yamauchi, Yokosuka, all of Japan

[73] Assignee: Asahi Glass Company, Ltd., Tokyo, Japan

[21] Appl. No.: 830,843

[22] Filed: Feb. 19, 1986

[30] Foreign Application Priority Data

Feb. 19, 1985 [JP]  Japan .................................. 60-29318

[51] Int. Cl.$^4$ .............................................. B05D 5/12
[52] U.S. Cl. ......................................... 427/58; 427/79; 427/96; 427/101; 427/385.5; 428/421
[58] Field of Search ...................... 427/58, 79, 96, 101, 427/385.5; 428/321

[56] References Cited

U.S. PATENT DOCUMENTS

| | | | |
|---|---|---|---|
| 3,931,454 | 1/1976 | Sprengling | 174/68.5 |
| 4,337,268 | 8/1982 | Close | 427/385.5 |
| 4,472,480 | 9/1984 | Olson | 427/385.5 X |
| 4,526,833 | 7/1985 | Burguette et al. | 428/421 X |
| 4,550,061 | 10/1985 | Sachdev et al. | 428/421 X |
| 4,554,172 | 11/1985 | Harrison | 427/385.5 X |

*Primary Examiner*—Thurman K. Page
*Attorney, Agent, or Firm*—Oblon, Fisher, Spivak, McClelland & Maier

[57] ABSTRACT

A method for moistureproof coating of an electrical product, which comprises applying an organic solution of a polyfluoroalkyl group-containing polymer dissolved in a non-combustible low boiling point organic solvent, to a surface of an electrical product, and drying it by evaporating the low boiling point organic solvent, to form a coating layer of the polyfluoroalkyl group-containing polymer on the surface of the electrical product, wherein said polyfluoroalkyl group-containing polymer is a copolymer of a polymerizable compound having a polyfluoroalkyl group with other polymerizable compound, and the copolymer has a glass transition temperature of not higher than 60° C.

7 Claims, No Drawings

METHOD FOR MOISTUREPROOF COATING OF AN ELECTRICAL PRODUCT

The present invention relates to a method for moistureproof coating which is useful for application to electrical products such as printed circuit boards for electrical or electronic devices.

Reflecting the micro-computerization of electrical or electronic devices, printed circuit boards are now incorporated in various household electrical appliances and industrial appliances. In many cases, they are used under high humidity environmental conditions, and it frequently happens that due to the adsorption of moisture or deposition of condensed water on such printed circuit boards, a leakage current is generated to cause operational errors.

In order to prevent such a leakage current, it is known to cover the printed circuit boards with a non-fluorine-type resin such as an acrylic resin, a urethane resin or an epoxy resin. It is also known to cover the boards with a fluorine-type homopolymer having polyfluoroalkyl groups from U.S. Pat. No. 3,931,454. It is usual to form a coating layer by applying such a resin in the form of an organic solution or a liquid resin, followed by drying or curing.

Among conventional methods for moistureproofing, those employing non-fluorine type resins, require a considerable time for drying or curing, and thus have a problem from the viewpoint of the working efficiency. Further, organic solvents are in many cases combustible, and thus have a problem from the viewpoint of the danger of fire and labour hygiene. Furthermore, there is a drawback that the generation of a leakage current is remarkable if a substantial amount of condensed water is deposited on the coating layer.

Thus, in the case of a moistureproof coating material made of a non-fluorine type resin such as an epoxy resin, a urethane resin or an acrylic resin, the moistureproof performance is not necessarily adequate, and it is usually required to provide a thick coating. Further, since a highly viscous coating material is employed, the coating layer is likely to have defects such as foams, and there is a problem also in the working efficiency, for instance, in the drying operation. With such a moistureproof coating material, it has been difficult to obtain an adequate moistureproof effect even when a thick coating is provided by means of a highly concentrated high viscosity coating material.

Further, reflecting the recent miniaturization and compact assembly of electrical and electronic devices, the miniaturization and integration are in progress also in electrical products such as printed circuit boards, and the thick coating for moistureproof coating is problematic also from such a viewpoint.

On the other hand, when a fluorine-type homopolymer is employed for such a coating, the moistureproof coating layer is desired to have good adhesion to the surface of the electrical product. The moistureproof coating layer of a fluorine-type homopolymer, it has a drawback that the adhesion to the substrate is poor. Electrical products which are required to have moistureproof and water resistant properties, are likely to be used under high temperature and high humidity environmental conditions. Under such environmental conditions, the adhesion properties are likely to deteriorate, and the coating of a fluorine-type homopolymer does not provide adequate adhesion.

The present inventors have conducted extensive researches and studies with an aim to solve the above-mentioned problems, and have found that a polyfluoroalkyl group-containing copolymer such as the one obtained by polymerizing a methacrylate having a perfluoroalkyl group with other copolymerizable compound such as cyclohexyl methacrylate, is soluble in a non-combustible low boiling point organic solvent such as trichlorotrifluoroethane, and it is possible to conduct moistureproof coating of an electrical product smoothly and advantageously by means of the organic solution thereby obtained. From such an organic solution, it is possible to readily form a thin coating layer. Even with such a thin coating, a high level of moistureproof properties and water resistance can be imparted to the electrical product. Thus, by using such an organic solution, an excellent moistureproof coating layer can be formed under quick drying and non-combustible conditions. Furthermore, by using as the copolymerizable compound a polymerizable compound such as cyclohexyl methacrylate which gives a polymer having a glass transition temperature of not higher than 60° C., it is possible to obtain not only the above-mentioned excellent properties but also good adhesion of the moistureproof coating layer to the surface of the electrical product. Thus, the present invention has been accomplished on the basis of the above discoveries.

The present invention provides a method for moistureproof coating of an electrical product, which comprises applying an organic solution of a polyfluoroalkyl group-containing polymer dissolved in a non-combustible low boiling point organic solvent, to a surface of an electrical product, and drying it by evaporating the low boiling point organic solvent, to form a coating layer of the polyfluoroalkyl group-containing polymer on the surface of the electrical product, wherein said polyfluoroalkyl group-containing polymer is a copolymer of a polymerizable compound having a polyfluoroalkyl group with other polymerizable compound, and the copolymer has a glass transition temperature of not higher than 60° C.

Now, the present invention will be described with reference to the preferred embodiments.

In the present invention, it is important to use a polyfluoroalkyl group-containing copolymer as the moistureproof coating material. By using such a moistureproof coating material, it is possible to impart a high level of waterproof properties even with a thin coating. Accordingly, it is possible to conduct the coating by means of an organic solution having a low concentration and a low viscosity, which is advantageous also from the view point of the operation efficiency. Further, the adhesion to the surface of the electrical product becomes extremely good, whereby stabilized moistureproof properties can be attained for a long period of time.

As the polymerizable compound having a polyfluoroalkyl group, the following unsaturated esters are preferred. For instance, the following acrylates or methacrylates may be mentioned as suitable ones, which may be used alone or in combination as a mixture of two or more.

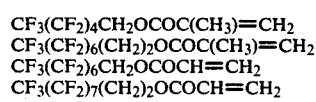

-continued

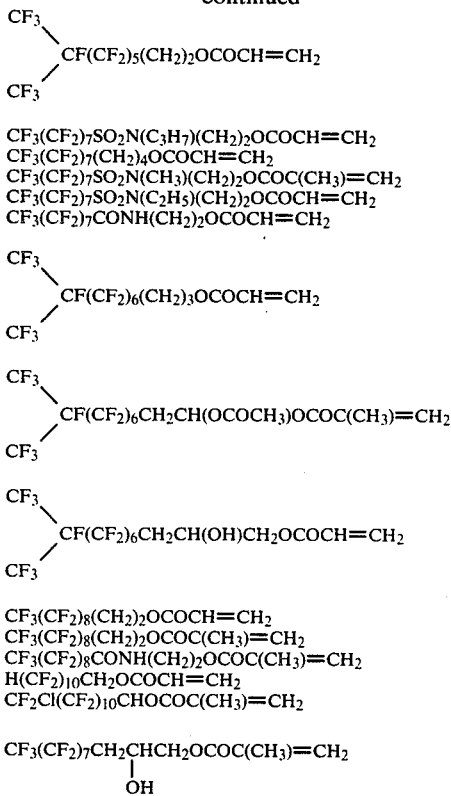

$CF_3(CF_2)_5(CH_2)_2OCOCH=CH_2$ (branched with two CF$_3$)

$CF_3(CF_2)_7SO_2N(C_3H_7)(CH_2)_2OCOCH=CH_2$
$CF_3(CF_2)_7(CH_2)_4OCOCH=CH_2$
$CF_3(CF_2)_7SO_2N(CH_3)(CH_2)_2OCOC(CH_3)=CH_2$
$CF_3(CF_2)_7SO_2N(C_2H_5)(CH_2)_2OCOCH=CH_2$
$CF_3(CF_2)_7CONH(CH_2)_2OCOCH=CH_2$ $(CF_3)_2CF(CF_2)_6(CH_2)_3OCOCH=CH_2$ $(CF_3)_2CF(CF_2)_6CH_2CH(OCOCH_3)OCOC(CH_3)=CH_2$ $(CF_3)_2CF(CF_2)_6CH_2CH(OH)CH_2OCOCH=CH_2$ $CF_3(CF_2)_8(CH_2)_2OCOCH=CH_2$
$CF_3(CF_2)_8(CH_2)_2OCOC(CH_3)=CH_2$
$CF_3(CF_2)_8CONH(CH_2)_2OCOC(CH_3)=CH_2$
$H(CF_2)_{10}CH_2OCOCH=CH_2$
$CF_2Cl(CF_2)_{10}CHOCOC(CH_3)=CH_2$ $$CF_3(CF_2)_7CH_2CHCH_2OCOC(CH_3)=CH_2$$
$$\mid$$
$$OH$$

The compound copolymerizable with the above-mentioned polymerizable compound having a polyfluoroalkyl group, may be selected within a wide range so long as it does not bring about any deterioration of the desired properties. It is a polymerizable compound which gives a copolymer having a glass transition temperature of not higher than 60° C. For instance, a wide range of compounds may be mentioned, including ethylene, vinyl acetate, vinyl chloride, vinyl fluoride, a vinylidene halide, styrene, α-methylstyrene, p-methylstyrene, acrylic acid and its alkyl exters, methacrylic acid and its alkyl esters, poly(oxyalkylene)acrylates, poly(oxyalkylene)methacrylates, acrylamide, methacrylamide, diacetone acrylamide and methacrylamide, methylol-modified diacetone acrylamide and methacrylamide, N-methylol acrylamide and methacrylamide, vinyl alkyl ethers, haloalkyl vinyl ethers, vinyl alkyl ketones, butadiene, isoprene, chloroprene, glycidyl acrylate and methacrylate, benzyl acrylate and methacrylate, cyclohexyl acrylate and methacrylate, 2-ethylhexyl acrylate and methacrylate, maleic anhydride, maleic acid and its alkyl esters, tetrahydrofurfuryl acrylate and methacrylate, aziridyl acrylate and methacrylate, dimethylaminoethyl acrylate and methacrylate, a polysiloxane-containing acrylate and methacrylate, and N-vinylcarbazole. These compounds may be used alone or in combination as a mixture of two or more.

In the present invention, an organic solution of the above-mentioned polyfluoroalkyl group-containing copolymer dissolved in a non-combustible low boiling point organic solvent, is applied and dried to form a coating layer on the surface of an electrical product. In order to form an excellent moistureproof coating layer by the application and drying, it is preferred to use a copolymer having good coating layer-forming properties, as the polyfluoroalkyl group-containing copolymer. Further, it is desired that the formed moistureproof coating layer has good adhesion to the surface of the electrical product, and the moistureproof coating layer itself has high strength. From the viewpoint of such desired solubility, coating layer-forming ability and adhesion, a compound which is capable of providing a polymer having a low glass transition temperature of not higher than 60° C., preferably not higher than 40° C., is employed as said other compound copolymerizable with the polymerizable compound having a polyfluoroalkyl group. For instance, as such other polymerizable compound, there may be mentioned as a preferred example, a polymerizable compound such as ethyl methacrylate, cyclohexyl methacrylate or n-butyl methacrylate. The glass transition temperature is preferably at least 20° C., since it is difficult to obtain a good coating layer if the glass transition temperature is too low.

In the present invention, the polyfluoroalkyl group-containing copolymer preferably contains from 30 to 90% by weight, more preferably from 60 to 80% by weight of the polymerizable compound having a polyfluoroalkyl group. Usually, the other compound copolymerizable with the polyfluoroalkyl group-containing polymerizable compound is incorporated in an amount of from 70 to 10% by weight, preferably from 40 to 20% by weight.

As the non-combustible low boiling point organic solvent, there may be employed a solvent which is capable of dissolving the above-mentioned polyfluoroalkyl group-containing copolymer. Usually, a chlorine-type solvent such as methylchloroform or a fluorine-containing organic solvent is employed. Particularly preferred is a fluorine-containing organic solvent such as 1,1,2-trichloro-1,2,2-trifluoroethane or 1,1-difluorotetrachloroethane having a boiling point of a level of from 40° to 100° C. These organic solvents may be used as a solvent mixture as the case requires. Further, in order to improve the solubility of the polyfluoroalkyl group-containing copolymer, other organic solvents may be employed together so long as the non-combustion properties can be maintained.

In the present invention, there is no particular restriction as to the concentration of the organic solution of the polyfluoroalkyl group-containing copolymer. However, the concentration is usually selected within a range of from 0.1 to 40% by weight, preferably from 3 to 15% by weight. If the concentration is too high, the viscosity of the solution tends to be excessive, whereby the coating operation will be difficult, and it will be difficult to obtain a uniform coating. On the other hand, if the concentration is too low, it will be difficult to obtain good moistureproof properties, and there will be a disadvantage also from the viewpoint of the efficiency of the drying operation for the recovery of a great amount of the solvent.

In the method of the present invention, there is no particular restriction as to the means and conditions for coating and drying the organic solution, and there may be employed various means and conditions. For instance, a dipping method or a spraying method may be employed for the application of the organic solution to the surface of an electrical product, and the drying temperature may be at a level of from 10° to 50° C.

Thus, a coating layer of the polyfluoroalkyl group-containing copolymer will be formed on the surface of the electrical product. The thickness of the coating layer is not particularly restricted, but is usually from 0.1 to 50 μm, preferably from 0.5 to 15 μm, whereby it is possible to impart superior moistureproof properties as compared with the conventional thick coating layer for moistureproofing.

The method of the present invention is applicable to the moistureproof coatings of various electrical products. For instance, it can be applied to a wide range of products including printed circuits boards, hybrid integrated circuits, resisters, capacitors, switches or connectors.

In the present invention, the polyfluoroalkyl group-containing copolymer forms a coating layer on the surface of an electrical product such as a printed circuit board after the evaporation of the non-combustible low boiling point organic solvent, and thus serves for the protection from the moisture or water. The polyfluoroalkyl groups contained in such a copolymer, serve to impart waterproof properties to the coating layer and at the same time to improve the solubility to the non-combustible low boiling point organic solvent such as 1,1,2-trichloro-1,2,2-trifluoroethane. The compound copolymerizable with the polymerizable compound containing a polyfluoroalkyl group, serves to improve the strength of the coating layer and the adhesion of the coating layer to the surface of the electrical product.

Now, the present invention will be described in further detail with reference to Examples. However, it should be understood that the present invention is by no means restricted by such specific Examples.

EXAMPLES 1 to 8 and COMPARATIVE EXAMPLES 1 to 7

A glass epoxy plate of 5×5 cm formed with comb-shaped electrodes with 21 teeth at intervals of 0.7 mm, was dipped in a test solution as identified in Table 1, and then withdrawn and dried at room temperature to obtain a test piece. By using this test piece, the moistureproof properties and the waterproof properties of the coating layer were examined. The results are shown in Table 1. The methods for evaluation were as follows:

Moistureproof properties:

The test piece was left to stand in a constant temperature and constant moisture chamber at 60° C. under a relative humidity of 95% for 500 hours, and then the insulation resistance was measured.

Waterproof properties:

The test piece was immersed in distilled water at 25° C. for 24 hours, and then the insulation resistance was measured.

Adhesion:

The coating layer on the test piece surface was cut crosswise by a sharp blade with cut lines reaching the substrate surface and defining 100 squares of 1 mm$^2$, and then an adhesive tape was pressed on the coating layer under a prescribed pressure and immediately peeled, whereupon the number of squares of the coating layer remained was counted.

TABLE 1

| | Copolymer composition (Numerical values represent % by weight) | Glass transition temperature (°C.) | Solvent | Concentration (% by weight) | Moistureproof properties (Ω) | Waterproof properties (Ω) | Adhesion |
|---|---|---|---|---|---|---|---|
| Example 1 | FA/MMA (60/40) | 54 | R-113 | 2.0 | $7 \times 10^{10}$ | $1 \times 10^{12}$ | 70/100 |
| Example 2 | FA/EMA (70/30) | 33 | R-113 | 2.0 | $2 \times 10^{11}$ | $8 \times 10^{11}$ | 100/100 |
| Example 3 | FA/BMA (80/20) | 20 | R-113 | 2.0 | $6 \times 10^{10}$ | $2 \times 10^{11}$ | 100/100 |
| Example 4 | FA/B$_2$MA (70/30) | 30 | R-113 | 2.0 | $6 \times 10^{10}$ | $1 \times 10^{12}$ | 100/100 |
| Example 5 | FA/CyHMA (80/20) | 29 | R-113 | 2.0 | $7 \times 10^{11}$ | $2 \times 10^{12}$ | 100/100 |
| Example 6 | FA/CyHMA/DMAEMA (80/18/2) | 28 | R-113 | 1.0 | $4 \times 10^{11}$ | $1 \times 10^{12}$ | 100/100 |
| Example 7 | FA/CyHMA/DMAEMA (80/18/2) | 28 | R-113 | 2.0 | $7 \times 10^{11}$ | $2 \times 10^{12}$ | 100/100 |
| Example 8 | FA/CyHMA/DMAEMA (80/18/2) | 28 | R-113 | 5.0 | $7 \times 10^{11}$ | $2 \times 10^{12}$ | 100/100 |
| Comparative Example 1 | FA homopolymer | 20 | R-113 | 2.0 | $1 \times 10^{11}$ | $2 \times 10^{12}$ | 50/100 |
| Comparative Example 2 | BMA homopolymer | 20 | Toluene | 25.0 | $3 \times 10^9$ | $1 \times 10^9$ | 100/100 |
| Comparative Example 3 | EMA homopolymer | 65 | Toluene | 30.0 | $7 \times 10^9$ | $4 \times 10^9$ | 50/100 |
| Comparative Example 4 | CyHMA/BMA (50/50) | 43 | Toluene | 2.0 | $3 \times 10^9$ | $4 \times 10^9$ | 60/100 |
| Comparative Example 5 | CyHMA/BMA (50/50) | 43 | Toluene | 30.0 | $1 \times 10^{10}$ | $1 \times 10^{10}$ | 70/100 |
| Comparative Example 6 | FA/MMA (50/50) | 65 | R-113 | 2.0 | $2 \times 10^{10}$ | $8 \times 10^{11}$ | 50/100 |
| Comparative Example 7 | Test piece with no coating | | | | $8 \times 10^7$ | $7 \times 10^7$ | — |

FA ... CH$_2$=CHCOOC$_2$H$_4$C$_9$F$_{19}$
MMA ... Methyl methacrylate
EMA ... Ethyl methacrylate
BMA ... n-Butyl methacrylate
B$_2$MA ... Benzyl methacrylate
CyHMA ... Cyclohexyl methacrylate
DMAEMA ... Dimethylaminoethyl methacrylate
R-113 ... 1,1,2-trichloro-1,2,2-trifluoroethane The moistureproof coating composition in the present invention has desired properties such as quick drying properties and non-combustible properties, and exhibits excellent characteristics also in the moistureproof properties and the waterproof properties. Further, the copolymer constituting the coating layer is soluble selectively in a solvent composed mainly of e.g. 1,1,2-trichloro-1,2,2-trifluoroethane, and hardly soluble or hardly eroded by other organic solvents. Further, the coating layer surface exhibits high water repellency, and even if condensed water is deposited, it is likely to be readily removed from the printed circuit board. Furthermore, the coating layer of the copolymer of the present invention, has extremely good adhesion.

We claim:

1. A method for moistureproof coating of an electrical product, which comprises applying an organic solution of a polyfluoroalkyl group-containing polymer dissolved in a non-combustible low boiling point organic solvent, to a surface of an electrical product, and drying it by evaporating the low boiling point organic solvent, to form a coating layer of the polyfluoroalkyl group-containing polymer on the surface of the electrical product, wherein said polyfluoroalkyl group-containing polymer is a copolymer of a polymerizable compound having a polyfluoroalkyl group with other polymerizable compound, and the copolymer has a glass transition temperature of not higher than 60° C.

2. The method according to claim 1, wherein the proportion of the polymerizable compound having a polyfluoroalkyl group in the copolymer is from 30 to 90% by weight.

3. The method according to claim 1, wherein the polymerizable compound having a polyfluoroalkyl group is an acrylate or methacrylate having a terminal polyfluoroalkyl group.

4. The method according to claim 1, wherein the organic solution contains from 0.1 to 40% by weight of the polyfluoroalkyl group-containing polymer.

5. The method according to claim 1, wherein the coating layer has a thickness of from 0.1 to 50 μm.

6. The method according to claim 1, wherein the electrical product is a printed circuit, an integrated circuit, a resistor, a capacitor, a switch or a connector.

7. An electrical product prepared by the method according to claim 1.

* * * * *